United States Patent
Santra et al.

(10) Patent No.: US 10,928,501 B2
(45) Date of Patent: Feb. 23, 2021

(54) TARGET DETECTION IN RAINFALL AND SNOWFALL CONDITIONS USING MMWAVE RADAR

(71) Applicant: Infineon Technologies AG, Neubiberg (DE)

(72) Inventors: Avik Santra, Munich (DE); Ashutosh Baheti, Munich (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 254 days.

(21) Appl. No.: 16/115,216

(22) Filed: Aug. 28, 2018

(65) Prior Publication Data
US 2020/0072958 A1    Mar. 5, 2020

(51) Int. Cl.
| | | |
|---|---|---|
| G01S 13/524 | (2006.01) | |
| H01L 23/00 | (2006.01) | |
| H01L 23/66 | (2006.01) | |

(52) U.S. Cl.
CPC ...... *G01S 13/5248* (2013.01); *G01S 13/5244* (2013.01); *H01L 23/564* (2013.01); *H01L 23/66* (2013.01); *H01L 2223/6677* (2013.01)

(58) Field of Classification Search
CPC ............ G01S 13/5248; G01S 13/5244; H01L 23/564; H01L 23/66; H01L 2223/6677
USPC ...................................................... 342/160
See application file for complete search history.

(56) References Cited

U.S. PATENT DOCUMENTS

| 3,780,369 A | * | 12/1973 | Auer ...................... G01S 13/583 |
| | | | 342/67 |
| 4,024,541 A | * | 5/1977 | Albanese ............... G01S 7/2923 |
| | | | 342/189 |
| 4,028,697 A | * | 6/1977 | Albanese ............... G01S 7/2923 |
| | | | 342/159 |
| 4,241,347 A | | 12/1980 | Albanese et al. |
| 4,636,793 A | * | 1/1987 | D'Addio ............. G01S 13/5244 |
| | | | 342/162 |
| 4,709,236 A | | 11/1987 | Taylor, Jr. |
| 4,713,664 A | | 12/1987 | Taylor, Jr. |

(Continued)

FOREIGN PATENT DOCUMENTS

| CN | 1463161 A | 12/2003 |
| CN | 1716695 A | 1/2006 |

(Continued)

OTHER PUBLICATIONS

Chen, Xiaolong et al., "Detection and Extraction of Target with Micromotion in Spiky Sea Clutter via Short-Time Fractional Fourier Transform", IEEE Transactions on Geoscience and Remote Sensing, vol. 52, No. 2, Feb. 2014, pp. 1002-1018.

(Continued)

*Primary Examiner* — Peter M Bythrow
*Assistant Examiner* — Nuzhat Pervin
(74) *Attorney, Agent, or Firm* — Slater Matsil, LLP

(57) ABSTRACT

A radar system includes a radio frequency (RF) circuit to generate a transmit signal and to receive a corresponding receive signal from a target during rainfall or snowfall conditions, and a signal processing circuit coupled to the RF circuit to generate an adaptive filter threshold in response to the rainfall or snowfall conditions, and to generate a valid target signal in response a portion of the receive signal above the adaptive filter threshold.

20 Claims, 7 Drawing Sheets

(56) References Cited

U.S. PATENT DOCUMENTS

| | | | |
|---|---|---|---|
| 5,327,141 A * | 7/1994 | Sheldon | G01S 13/524 342/159 |
| 5,905,459 A * | 5/1999 | Bunch | G01S 7/34 342/205 |
| 6,147,572 A | 11/2000 | Kaminski et al. | |
| 6,307,500 B1 * | 10/2001 | Cornman | G01S 13/951 342/26 R |
| 6,414,631 B1 | 7/2002 | Fujimoto | |
| 6,420,995 B1 * | 7/2002 | Richmond | G01S 7/36 342/13 |
| 6,636,174 B2 | 10/2003 | Arikan et al. | |
| 7,048,973 B2 | 5/2006 | Sakamoto et al. | |
| 7,057,564 B2 | 6/2006 | Tsai et al. | |
| 7,171,052 B2 | 1/2007 | Park | |
| 7,317,417 B2 | 1/2008 | Arikan et al. | |
| 7,596,241 B2 | 9/2009 | Rittscher et al. | |
| 7,692,574 B2 | 4/2010 | Nakagawa | |
| 7,873,326 B2 | 1/2011 | Sadr | |
| 7,889,147 B2 | 2/2011 | Tam et al. | |
| 8,228,382 B2 | 7/2012 | Pattikonda | |
| 8,497,805 B2 | 7/2013 | Rofougaran et al. | |
| 8,659,369 B2 | 2/2014 | Rofougaran et al. | |
| 8,731,502 B2 | 5/2014 | Salle et al. | |
| 8,836,596 B2 | 9/2014 | Richards et al. | |
| 8,847,814 B2 | 9/2014 | Himmelstoss et al. | |
| 8,860,532 B2 | 10/2014 | Gong et al. | |
| 8,976,061 B2 | 3/2015 | Chowdhury | |
| 9,172,132 B2 | 10/2015 | Kam et al. | |
| 9,202,105 B1 | 12/2015 | Wang et al. | |
| 9,413,079 B2 | 8/2016 | Kamgaing et al. | |
| 9,495,600 B2 | 11/2016 | Heu et al. | |
| 9,886,095 B2 | 2/2018 | Pothier | |
| 9,935,065 B1 | 4/2018 | Baheti et al. | |
| 10,317,520 B2 * | 6/2019 | Capraro | G01S 13/867 |
| 2003/0117311 A1 * | 6/2003 | Funai | G01S 13/34 342/26 R |
| 2003/0179127 A1 | 9/2003 | Wienand | |
| 2004/0238857 A1 | 12/2004 | Beroz et al. | |
| 2006/0001572 A1 | 1/2006 | Gaucher et al. | |
| 2006/0012511 A1 * | 1/2006 | Dooi | G01S 13/08 342/70 |
| 2006/0049995 A1 | 3/2006 | Imaoka et al. | |
| 2006/0067456 A1 | 3/2006 | Ku et al. | |
| 2007/0023896 A1 * | 2/2007 | Dangelmaier | H01L 24/48 257/728 |
| 2007/0210959 A1 | 9/2007 | Herd | |
| 2007/0273008 A1 * | 11/2007 | Suzuki | H01L 23/552 257/659 |
| 2007/0273572 A1 * | 11/2007 | Thomas | G01S 13/882 342/68 |
| 2008/0106460 A1 | 5/2008 | Kurtz et al. | |
| 2008/0238759 A1 | 10/2008 | Carocari et al. | |
| 2008/0291115 A1 | 11/2008 | Doan et al. | |
| 2008/0308917 A1 | 12/2008 | Pressel et al. | |
| 2009/0073026 A1 | 3/2009 | Nakagawa | |
| 2009/0085815 A1 | 4/2009 | Jakab et al. | |
| 2009/0109083 A1 * | 4/2009 | Tietjen | G01S 13/5244 342/91 |
| 2009/0123261 A1 * | 5/2009 | Richman | A01D 46/085 414/502 |
| 2009/0153428 A1 | 6/2009 | Rofougaran et al. | |
| 2009/0315761 A1 | 12/2009 | Walter et al. | |
| 2010/0207805 A1 | 8/2010 | Haworth | |
| 2011/0006862 A1 * | 1/2011 | Yasooka | H01L 23/055 333/230 |
| 2011/0299433 A1 | 12/2011 | Darabi et al. | |
| 2011/0304012 A1 * | 12/2011 | Kim | H01L 23/3128 257/531 |
| 2012/0083705 A1 * | 4/2012 | Yuen | A61B 5/0002 600/508 |
| 2012/0087230 A1 | 4/2012 | Guo et al. | |
| 2012/0092284 A1 | 4/2012 | Rofougaran et al. | |
| 2012/0116231 A1 | 5/2012 | Liao et al. | |
| 2012/0195161 A1 | 8/2012 | Little et al. | |
| 2012/0206339 A1 | 8/2012 | Dahl | |
| 2012/0280900 A1 | 11/2012 | Wang et al. | |
| 2013/0027240 A1 | 1/2013 | Chowdhury | |
| 2013/0106673 A1 | 5/2013 | McCormack et al. | |
| 2014/0028542 A1 | 1/2014 | Lovitt et al. | |
| 2014/0062760 A1 * | 3/2014 | Asada | G01S 13/505 342/107 |
| 2014/0070994 A1 | 3/2014 | Schmalenberg et al. | |
| 2014/0110841 A1 * | 4/2014 | Beer | H01L 23/49816 257/738 |
| 2014/0145883 A1 | 5/2014 | Baks et al. | |
| 2014/0268583 A1 * | 9/2014 | Ding | H05K 9/00 361/728 |
| 2014/0324888 A1 | 10/2014 | Xie et al. | |
| 2015/0145717 A1 * | 5/2015 | Lim | G01S 7/025 342/26 R |
| 2015/0181840 A1 | 7/2015 | Tupin, Jr. et al. | |
| 2015/0185316 A1 | 7/2015 | Rao et al. | |
| 2015/0212198 A1 | 7/2015 | Nishio et al. | |
| 2015/0243575 A1 | 8/2015 | Strothmann et al. | |
| 2015/0277569 A1 | 10/2015 | Sprenger et al. | |
| 2015/0325925 A1 | 11/2015 | Kamgaing et al. | |
| 2015/0346820 A1 | 12/2015 | Poupyrev et al. | |
| 2015/0348821 A1 | 12/2015 | Iwanaga et al. | |
| 2015/0364816 A1 | 12/2015 | Murugan et al. | |
| 2016/0018511 A1 | 1/2016 | Nayyar et al. | |
| 2016/0041617 A1 | 2/2016 | Poupyrev | |
| 2016/0041618 A1 | 2/2016 | Poupyrev | |
| 2016/0061942 A1 | 3/2016 | Rao et al. | |
| 2016/0061947 A1 | 3/2016 | Patole et al. | |
| 2016/0098089 A1 | 4/2016 | Poupyrev | |
| 2016/0103213 A1 | 4/2016 | Ikram et al. | |
| 2016/0109566 A1 | 4/2016 | Liu et al. | |
| 2016/0118353 A1 | 4/2016 | Ahrens et al. | |
| 2016/0146931 A1 | 5/2016 | Rao et al. | |
| 2016/0146933 A1 | 5/2016 | Rao et al. | |
| 2016/0178730 A1 | 6/2016 | Trotta et al. | |
| 2016/0187462 A1 | 6/2016 | Altus et al. | |
| 2016/0191232 A1 | 6/2016 | Subburaj et al. | |
| 2016/0240907 A1 | 8/2016 | Haroun | |
| 2016/0245911 A1 * | 8/2016 | Wang | G01S 7/292 |
| 2016/0249133 A1 | 8/2016 | Sorensen | |
| 2016/0252607 A1 | 9/2016 | Saboo et al. | |
| 2016/0259037 A1 | 9/2016 | Molchanov et al. | |
| 2016/0266233 A1 | 9/2016 | Mansour | |
| 2016/0269815 A1 | 9/2016 | Liao et al. | |
| 2016/0291130 A1 | 10/2016 | Ginsburg et al. | |
| 2016/0299215 A1 | 10/2016 | Dandu et al. | |
| 2016/0306034 A1 | 10/2016 | Trotta et al. | |
| 2016/0320852 A1 | 11/2016 | Poupyrev | |
| 2016/0320853 A1 | 11/2016 | Lien et al. | |
| 2016/0327633 A1 | 11/2016 | Kumar et al. | |
| 2016/0334502 A1 | 11/2016 | Ali et al. | |
| 2016/0349845 A1 | 12/2016 | Poupyrev et al. | |
| 2017/0030737 A1 * | 2/2017 | Elie | G01D 5/14 |
| 2017/0033062 A1 | 2/2017 | Liu et al. | |
| 2017/0045607 A1 | 2/2017 | Bharadwaj et al. | |
| 2017/0052618 A1 | 2/2017 | Lee et al. | |
| 2017/0054449 A1 | 2/2017 | Mani et al. | |
| 2017/0060254 A1 | 3/2017 | Molchanov et al. | |
| 2017/0070952 A1 | 3/2017 | Balakrishnan et al. | |
| 2017/0074974 A1 | 3/2017 | Rao et al. | |
| 2017/0074980 A1 | 3/2017 | Adib et al. | |
| 2017/0090014 A1 | 3/2017 | Subburaj et al. | |
| 2017/0090015 A1 | 3/2017 | Breen et al. | |
| 2017/0115377 A1 | 4/2017 | Giannini et al. | |
| 2017/0131395 A1 | 5/2017 | Reynolds et al. | |
| 2017/0139036 A1 | 5/2017 | Nayyar et al. | |
| 2017/0169681 A1 * | 6/2017 | Markaryan | G08B 13/2482 |
| 2017/0170947 A1 | 6/2017 | Yang | |
| 2017/0176574 A1 | 6/2017 | Eswaran et al. | |
| 2017/0192847 A1 | 7/2017 | Rao et al. | |
| 2017/0201019 A1 | 7/2017 | Trotta | |
| 2017/0212597 A1 | 7/2017 | Mishra | |
| 2017/0269200 A1 * | 9/2017 | Liu | G01S 13/34 |
| 2017/0364160 A1 | 12/2017 | Malysa et al. | |
| 2018/0046255 A1 | 2/2018 | Rothera et al. | |
| 2018/0071473 A1 | 3/2018 | Trotta et al. | |
| 2018/0074185 A1 * | 3/2018 | Capraro | G01S 13/42 |

(56) References Cited

U.S. PATENT DOCUMENTS

| | | | |
|---|---|---|---|
| 2018/0101239 A1 | 4/2018 | Yin et al. | |
| 2018/0233018 A1* | 8/2018 | Burwinkel | G08B 21/0492 |
| 2018/0331041 A1* | 11/2018 | Liao | H01Q 1/2283 |

FOREIGN PATENT DOCUMENTS

| | | | | |
|---|---|---|---|---|
| CN | 101490578 | A | 7/2009 | |
| CN | 101585361 | A | 11/2009 | |
| CN | 102788969 | A | 11/2012 | |
| CN | 102967854 | A | 3/2013 | |
| CN | 103529444 | A | 1/2014 | |
| CN | 203950036 | U | 11/2014 | |
| DE | 102008054570 | A1 | 6/2010 | |
| DE | 102011075725 | A1 | 11/2012 | |
| DE | 102014118063 | A1 | 7/2015 | |
| EP | 0056884 | A1 * | 8/1982 | G01S 13/342 |
| EP | 0086635 | A2 * | 8/1983 | G01S 13/953 |
| EP | 0132232 | A2 | 1/1985 | |
| EP | 0660135 | A2 * | 6/1995 | G01S 13/931 |
| EP | 1357395 | A1 | 10/2003 | |
| GB | 2247799 | A | 11/1992 | |
| JP | 2001174539 | A | 6/2001 | |
| JP | 2004198312 | A | 7/2004 | |
| JP | 2006234513 | A | 9/2006 | |
| JP | 2008029025 | A | 2/2008 | |
| JP | 2008089614 | A | 4/2008 | |
| JP | 2009069124 | A | 4/2009 | |
| JP | 2011529181 | A | 12/2011 | |
| JP | 2012112861 | A | 6/2012 | |
| JP | 2013521508 | A | 6/2013 | |
| JP | 2014055957 | A | 3/2014 | |
| KR | 20090063166 | A | 6/2009 | |
| KR | 20140082815 | A | 7/2014 | |
| WO | 2007060069 | A1 | 5/2007 | |
| WO | 2013009473 | A2 | 1/2013 | |
| WO | 2016033361 | A1 | 3/2016 | |

OTHER PUBLICATIONS

Chen, Xiaolong et al., "Detection and Extraction of Marine Target with Micromotion via Short-Time Fractional Fourier Transform in Sparse Domain," IEEE International Conference on Signal Processing, Communications and Computing, ICSPCC, Aug. 5-8, 2016, 5 pages.

Chuanhua, Du, "FMCW Radar Range-Doppler Processing and Beam Formation Technology," Chinese Doctoral Dissertations & Master's Theses Full Text Database (Masters)—Information Science and Technology Series, China National Knowledge Infrastructure, ISSN 1674-0246, CN 11-9144/G, Dec. 16, 2004-Mar. 2015, 14 pages.

Deacon, Peter et al., "Frequency Modulated Continuous Wave (FMCW) Radar," Design Team 6 Technical Lecture, Nov. 9, 2011, 27 pages.

Diederichs, Kailtyn et al., "Wireless Biometric Individual Identification Utilizing Millimeter Waves", IEEE Sensors Letters, vol. 1, No. 1, IEEE Sensors Council 3500104, Feb. 2017, 4 pages.

Dooring Alert Systems, "Riders Matter," http:\\dooringalertsystems.com, printed Oct. 4, 2017, 16 pages.

Filippelli, Mario et al., "Respiratory dynamics during laughter," J Appl Physiol, (90), 1441-1446, Apr. 2001, http://iap.physiology.org/content/jap/90/4/1441.full.pdf.

Fox, Ben, "The Simple Technique That Could Save Cyclists' Lives," https://www.outsideonline.com/2115116/simple-technique-could-save-cyclists-lives, Sep. 19, 2016, 6 pages.

Gu, Changzhan et al., "Assessment of Human Respiration Patterns via Noncontact Sensing Using Doppler Multi-Radar System", Sensors Mar. 2015, 15(3), 6383-6398, doi: 10.3390/s150306383, 17 pages.

Guercan, Yalin "Super-resolution Algorithms for Joint Range-Azimuth-Doppler Estimation in Automotive Radars," Technische Universitet Delft, TUDelft University of Technology Challenge the Future, Jan. 25, 2017, 72 pages.

Inac, Ozgur et al., "A Phased Array RFIC with Built-in Self-Test Capabilities," IEEE Transactions on Microwave Theory and Techniques, vol. 60, No. 1, Jan. 2012, 10 pages.

Kizhakkel, V., "Pulsed Radar Target Recognition Based on Micro-Doppler Signatures Using Wavelet Analysis", a Thesis, Graduate Program in Electrical and Computer Engineering, Ohio State University, Jan. 2013-May 2013, 118 pages.

Kuehnke, Lutz, "Phased Array Calibration Procedures Based on Measured Element Patterns," 2001 Eleventh International Conference on Antennas and Propagation, IEEE Conf., Publ. No. 480, Apr. 17-20, 2001, 4 pages.

Lim, Soo-Chul et al., "Expansion of Smartwatch Touch Interface from Touchscreen to Around Device Interface Using Infrared Line Image Sensors," Sensors 2015, ISSN 1424-8220, vol. 15, 16642-16653, doi:10.3390/s150716642, www.mdpi.com/journal/sensors, Jul. 15, 2009, 12 pages.

Lin, Jau-Jr et al., "Design of an FMCW radar baseband signal processing system for automotive application," SpringerPlus a SpringerOpen Journal, (2016) 5:42, http://creativecommons.org/licenses/by/4.0/, DOI 10.1186/s40064-015-1583-5; Jan. 2016, 16 pages.

Microwave Journal Frequency Mailers, "Single-Chip 24 GHz Radar Front End," Infineon Technologies AG, www.microwavejournal.com/articles/print/21553-single-chip-24-ghz-radar-front-end, Feb. 13, 2014, 2 pages.

Schroff, Florian et al., "FaceNet: A Unified Embedding for Face Recognition and Clustering," CVF, CVPR2015, IEEE Computer Society Conference on Computer Vision and Pattern Recognition; Mar. 12, 2015, pp. 815-823.

Simon, W., et al., "Highly Integrated KA-Band Tx Frontend Module Including 8×8 Antenna Array," IMST GmbH, Germany, Asia Pacific Microwave Conference, Dec. 7-10, 2009, 63 pages.

Suleymanov, Suleyman, "Design and Implementation of an FMCW Radar Signal Processing Module for Automotive Applications," Master Thesis, University of Twente, Aug. 31, 2016, 61 pages.

Thayaparan, T. et al., "Intelligent target recognition using micro-Doppler radar signatures," Defence R&D Canada, Radar Sensor Technology III, Proc. of SPIE, vol. 7308, 730817, Dec. 9, 2009, 11 pages.

Thayaparan, T. et al., "Micro-Doppler Radar Signatures for Intelligent Target Recognition," Defence Research and Development Canada, Technical Memorandum, DRDC Ottawa TM 2004-170, Sep. 2004, 73 pages.

Wilder, Carol N., et al., "Respiratory patterns in infant cry," Canada Journal of Speech, Human Communication Winter, 1974-75, http://cjslpa.ca/files/1974_HumComm_Vol_01/No_03_2-60/Wilder_Baken_HumComm_1974.pdf, pp. 18-34.

Xin, Qin et al., "Signal Processing for Digital Beamforming FMCW SAR," Hindawi Publishing Corporation, Mathematical Problems in Engineering, vol. 2014, Article ID 859890, http://dx.doi.org/10.1155/2014/859890, 11 pages.

Amein, Ahmed S., et al., "Focused ISAR Imaging of Rotating Target in Far-Field Compact Range Anechoic Chamber," ResearchGate, https://www.researchgate.net/publication/291971655, May 2014, 7 pages.

"Gaussian Filtering" the University of Auckland, New Zealand, https://www.cs.auckland.ac.nz/courses/compsci373s1c/PatricesLectures/Gaussian%20Filtering_1up.pdf, May 23, 2010, 15 pages.

"Vertical Wind Tunnels—Just How do they Work?" iFly Indoor Skydiving, https://downunder.iflyworld.com/what-is-ifly/technology, 2013, printed Mar. 26, 2018, 3 pages.

Richards, Mark A., "Fundamentals of Radar Signal Processing," McGraw Hill Electronic Engineering, ISBN: 0-07-144474-2, Jun. 2005, 93 pages.

* cited by examiner

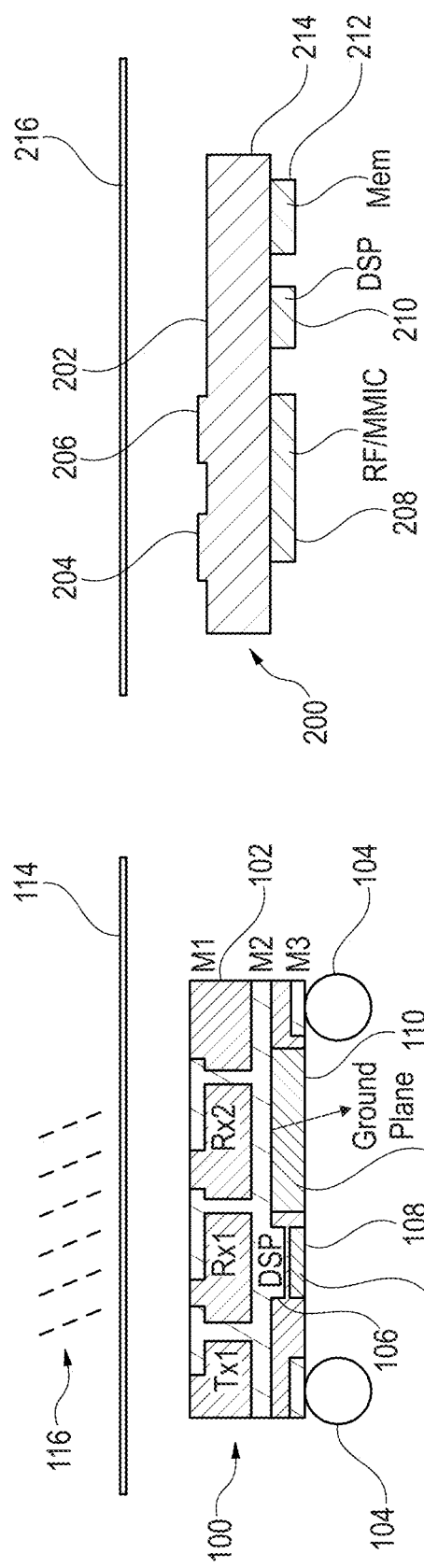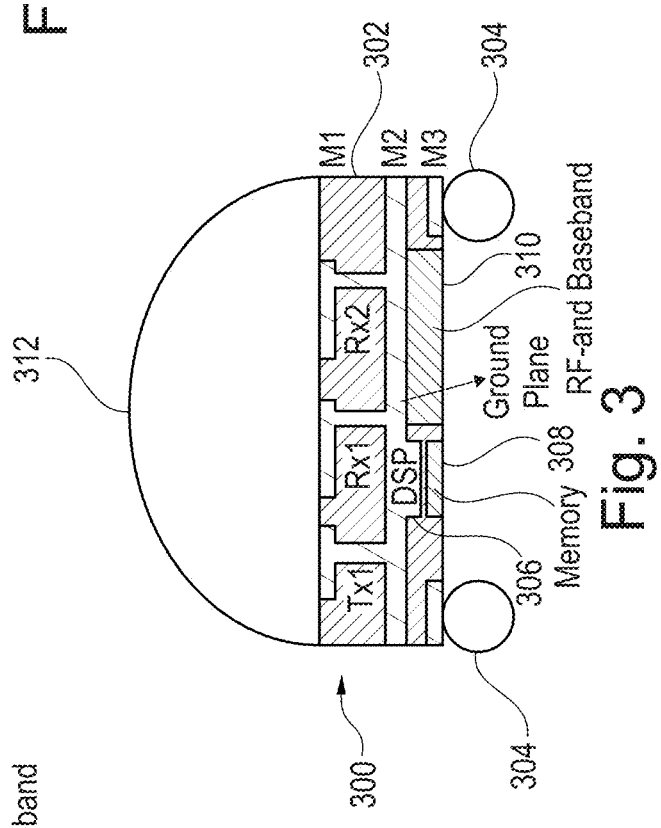

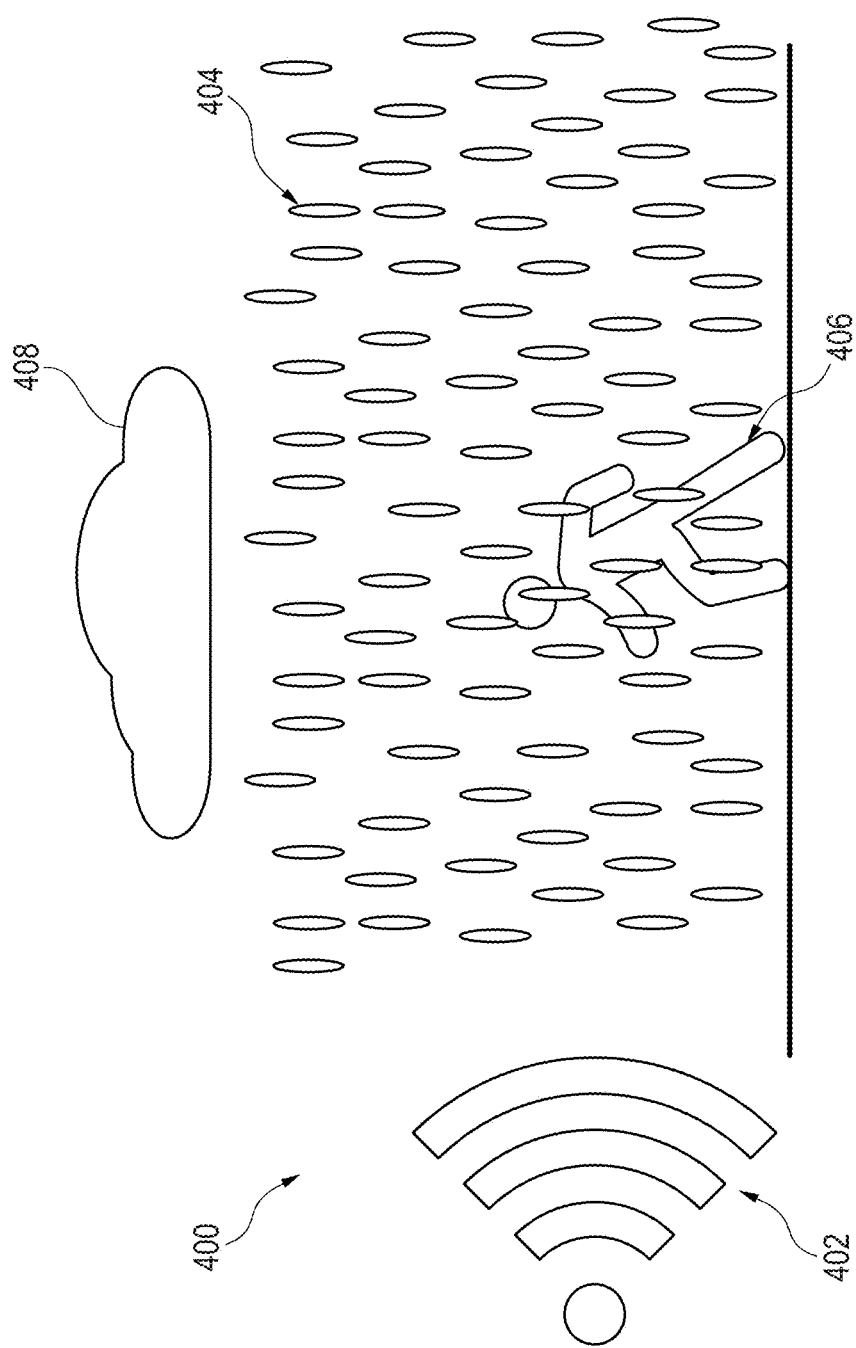

TARGET DETECTION IN RAINFALL AND SNOWFALL CONDITIONS USING MMWAVE RADAR

TECHNICAL FIELD

The present invention relates generally to a system and method for target detection in rainfall and snowfall conditions using millimeter wave ("mmWave") radar.

BACKGROUND

The operation of escalators and automatic doors can be controlled with motion sensors, as is known in the art. The motion sensors are used to control the operation of the escalator or automatic door when a person approaches. The escalator or the automatic door opener sensors are based on Doppler/motion and are therefore also enabled whenever there is rainfall or snowfall. To counteract this undesired mode of operation, electrode rain sensors or rain gauges that use infrared ("IR") light are sometimes used. While some information is provided by these sensors, they can only detect the presence or absence of rain. Additional information cannot be provided like quantity and speed of rainfall. Another disadvantage of these types of sensors is that the electrode needs actual contact with rain drops and thus wear and tear on the sensor is very high. In the case of IR sensors, lighting conditions can also create an impact on correct values. Both sensors are subjected to changes in performance with respect to temperature and environmental conditions.

SUMMARY

In accordance with an embodiment, a radar system comprises a radio frequency (RF) circuit configured to generate a transmit signal and to receive a corresponding receive signal from a target during rainfall or snowfall conditions; and a signal processing circuit coupled to the RF circuit configured to generate an adaptive filter threshold in response to the rainfall or snowfall conditions, and to generate a valid target signal in response a portion of the receive signal above the adaptive filter threshold.

The radar system can be used with an adaptive control system for controlling escalators and automatic doors, as well as other appliances, in changing weather conditions observed by the radar system. Understanding the amount and intensity of rainfall and snowfall, and detecting human targets during these conditions can be used to control the operation of appliances such as doors and escalators that reduce "false positive" operational modes. The radar system is thus used to detect the amount and speed of rainfall and snowfall, and to use this information in detecting human targets. The valid target detection can thus be used in controlling the operation of the appliances substantially without false positive operational modes.

Thus, an advantage of an embodiment is the detection of a human being in rainfall/snowfall conditions and only then activating the appliance actuators thus removing false alarms and thus improving energy efficiency.

Integration of mmWave radar sensor with/without lens solutions can be thus used to detect human targets and measure the rainfall and snowfall conditions. The radar system according to an embodiment has no adverse impact from lighting conditions, and can be covered under plastics for a stealth mode of operation. A fully integrated mmWave radar sensor solution can be used for human detection, rainfall/snowfall estimation and adaptive system controlling of appliances based on weather conditions. The radar system can be supplied in a package with an integrated antenna, RF front end, as well as baseband and processing circuits. Integration of a lens can be included in an embodiment. Algorithms for human detection and snowfall/rainfall amounts estimation can be made on a digital signal processing core inside the package, in an embodiment.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a radar system/sensor in a semiconductor package having a plastic shield according to an embodiment;

FIG. 2 is a radar system/sensor on a Printed Circuit Board ("PCB") having a plastic shield according to an embodiment;

FIG. 3 is a radar system/sensor in a semiconductor package having a lens according to an embodiment;

FIG. 4 is a diagram of radar detection of a human target in rainfall and snowfall clutter according to an embodiment;

DETAILED DESCRIPTION OF ILLUSTRATIVE EMBODIMENTS

Figure 5:
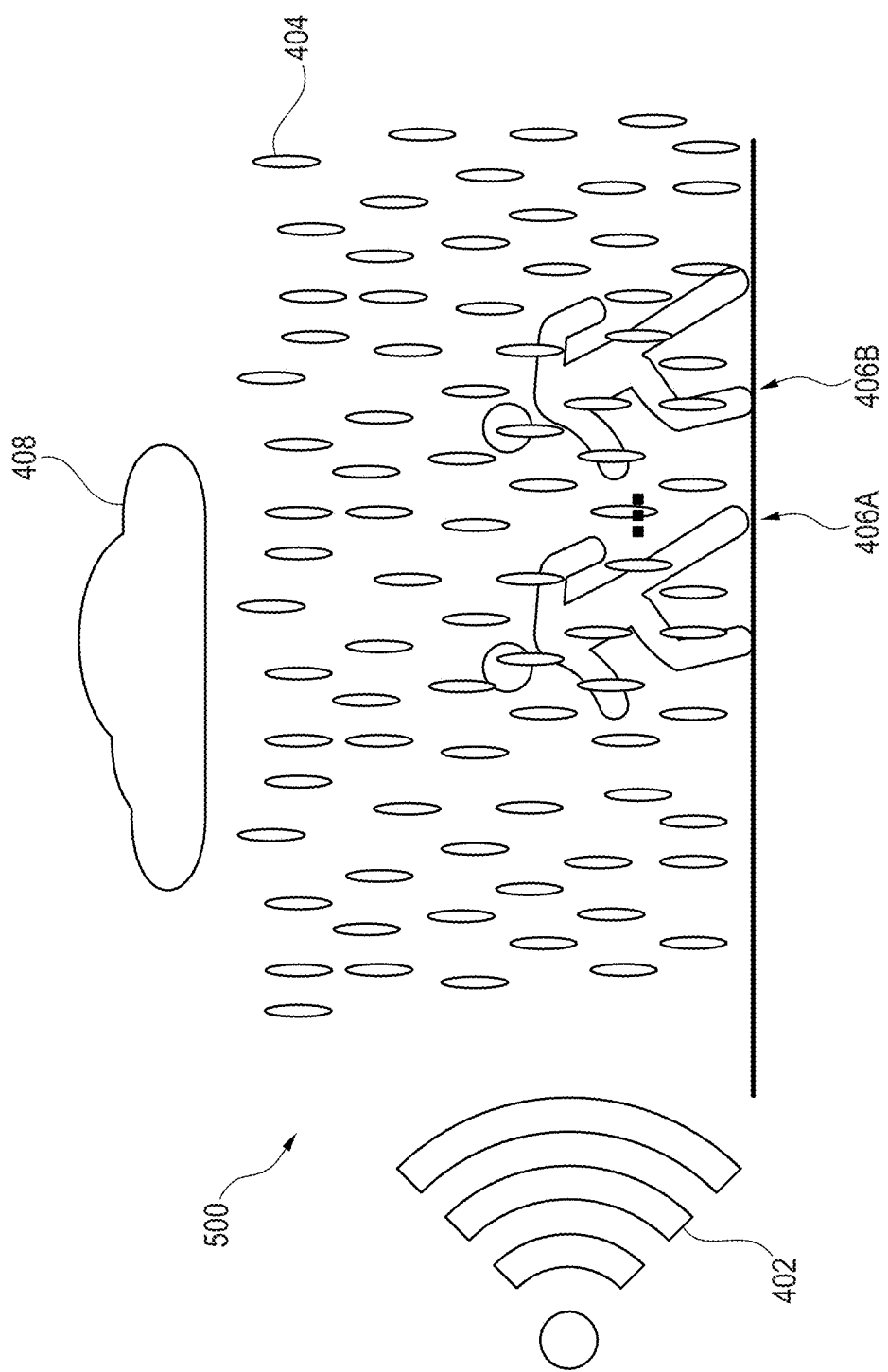
FIG. 5 is a diagram or radar detection and tracking of a human target in rainfall and snowfall clutter according to an embodiment.

FIG. 1 is a radar system/sensor 100 in a semiconductor package 102 having a plastic shield 114 to prevent direct exposure to rain or snow 116, according to an embodiment. Semiconductor package 102 includes a transmitter Tx1, and two receivers Rx1 and Rx2 that can be formed in a first level metal M1, in an embodiment. A second level metal M2 can be used as a ground plane, in an embodiment. A third level metal M3 can be used as an interconnect layer for interfacing with ball bonds 104. Semiconductor package 102 includes all of the circuitry for the radar system/sensor 100 including Digital Signal Processing ("DSP") processing circuitry 106, memory 108, and RF and baseband circuitry 110. Semiconductor package 102 can be formed out of ceramic or plastic or other materials known in the art. Plastic shield 114 can comprise a plastic polycarbonate material or an Acrylonitrile Butadiene Styrene ("ABS") material. Plastic shield 114 need not be transparent to visible light, but is transparent at millimeter radar frequencies. Plastic shield 114 can be affixed directly to package 102 or to a substrate (not shown) associated with package 102. Semiconductor package 102 can have additional metal and insulating layers, vias, interconnects, circuits, and other packaging artifacts according to embodiments.

FIG. 2 is a radar system/sensor 200 on a Printed Circuit Board ("PCB") 202 having a plastic shield 216 according to an embodiment. PCB 202 includes a transmitter 204, and two or more receivers 206 that can be formed in a first level metal, in an embodiment. A second level metal 214 can be used as a ground plane, in an embodiment. A third level metal (not shown) can be used as an interconnect layer for interfacing with ball bonds or other interconnect features (not shown). Semiconductor package 202 includes all of the circuitry for the radar system/sensor 200 including RF microwave integrated circuit ("RF/MMIC") circuitry 208, DSP circuitry 210, and memory 212. PCB 202 can be formed out of fiberglass or other materials known in the art. Plastic shield 216 can comprise a plastic polycarbonate material or an ABS material. Plastic shield 216 need not be transparent to visible light, but is transparent at millimeter radar frequencies. Plastic shield 216 can be affixed directly to PCB 202 or to a substrate (not shown) associated with PCB 202. PCB 102 can have additional metal and insulating layers, vias, interconnects, circuits, and other such artifacts according to embodiments.

FIG. 3 is a radar system/sensor 300 in a semiconductor package 302 having a lens 312 according to an embodiment. The lens 312 can be configured (shaped) to enhance beam performance, or can be used solely for protection of the sensor against environmental elements without necessarily enhancing beam performance. Semiconductor package 302 includes a transmitter Tx1, and two receivers Rx1 and Rx2 that can be formed in a first level metal M1, in an embodiment. A second level metal M2 can be used a ground plane, in an embodiment. A third level metal M3 can be used as an interconnect layer for interfacing with ball bonds 304. Semiconductor package 302 includes all of the circuitry for the radar system/sensor 100 including DSP processing circuitry 306, memory 308, and RF and baseband circuitry 310. Semiconductor package 102 can be formed out of ceramic or plastic or other materials known in the art. Lens 312 can comprise a plastic polycarbonate material or an ABS material, as well as other plastic or glass materials. Lens 312 need not be transparent to visible light, but is transparent at millimeter radar frequencies. Lens 312 can be affixed directly to package 302 as shown, in an embodiment. Semiconductor package 302 can have additional metal and insulating layers, vias, interconnects, circuits, and other packaging artifacts according to embodiments.

FIGS. 1, 2, and 3 show embodiments wherein a minimum 1Tx/1Rx solution can be used for rainfall/snowfall detection or target detection during rainfall/snowfall conditions, and an additional receiver can be used to track the movement of human being targets to generate a valid target approaching signal as is described in further detail below.

FIG. 4 shows an example scenario 400 of human target 406 detection using a radar 402 in rainfall or snowfall clutter conditions 404 produced by rain or snow clouds 408. FIG. 5 shows an example scenario 500 of human target tracking from location 406B to 406A using radar 402 in rainfall or snowfall clutter conditions 404 produced by rain or snow clouds 408. Human target tracking can be used to generate a valid target approaching signal that in turn can be used to activate an appliance actuator, wherein the appliance is also subjected to rainfall or snowfall conditions. An actuator is a component of an appliance that is responsible for moving and controlling a mechanism or system therein. An actuator driver is an electronic device such as an integrated circuit for appropriately energizing the actuator in response to an input signal.

Rain or snow clutter can be diffusive and windblown, and thus presents a challenge to both human target detection and human target tracking. Rainfall or snowfall can have a radar signature 30+dB or more, greater than that of a human target. Rainfall or snowfall can have a small Doppler spread around zero. Thus, a single filter with a notch at zero Doppler will not adequately reject rain. A set of pass band Doppler filters using 16-32 consecutive pulses can be constructed having a notch at zero Doppler. This implementation is sufficient to reject ground clutter but is not sufficient for rain clutter or snow clutter since tangential velocity detected by the radar introduces non-zero components near zero Doppler. A set of passband filters that are away from the zero Doppler can detect targets where no rain is present.

Doppler filter banks with adaptive thresholding for each range-Doppler combination are used for first level processing, according to an embodiment. The near zero-Doppler bins store rain clutter map, which are used for thresholding. The other pass band filter banks have adaptive threshold based on the mean noise floor. Second level processing measures the range spread of the detected target to discriminate between an actual human target and rain clutter.

Based on the post-processing detection, a valid target (human) is fed into a tracking algorithm to monitor its direction of movement. For example, if the direction of the detected target is towards the sensor over a predetermined period of time, e.g., 1-2 seconds, an actuator is activated to enable the operation of an appliance such as an escalator or an automatic door. A separate Kalman filter track may be enabled for each valid target detected and if any of the valid targets satisfies the above time duration condition, the actuator is enabled.

Figure 6:
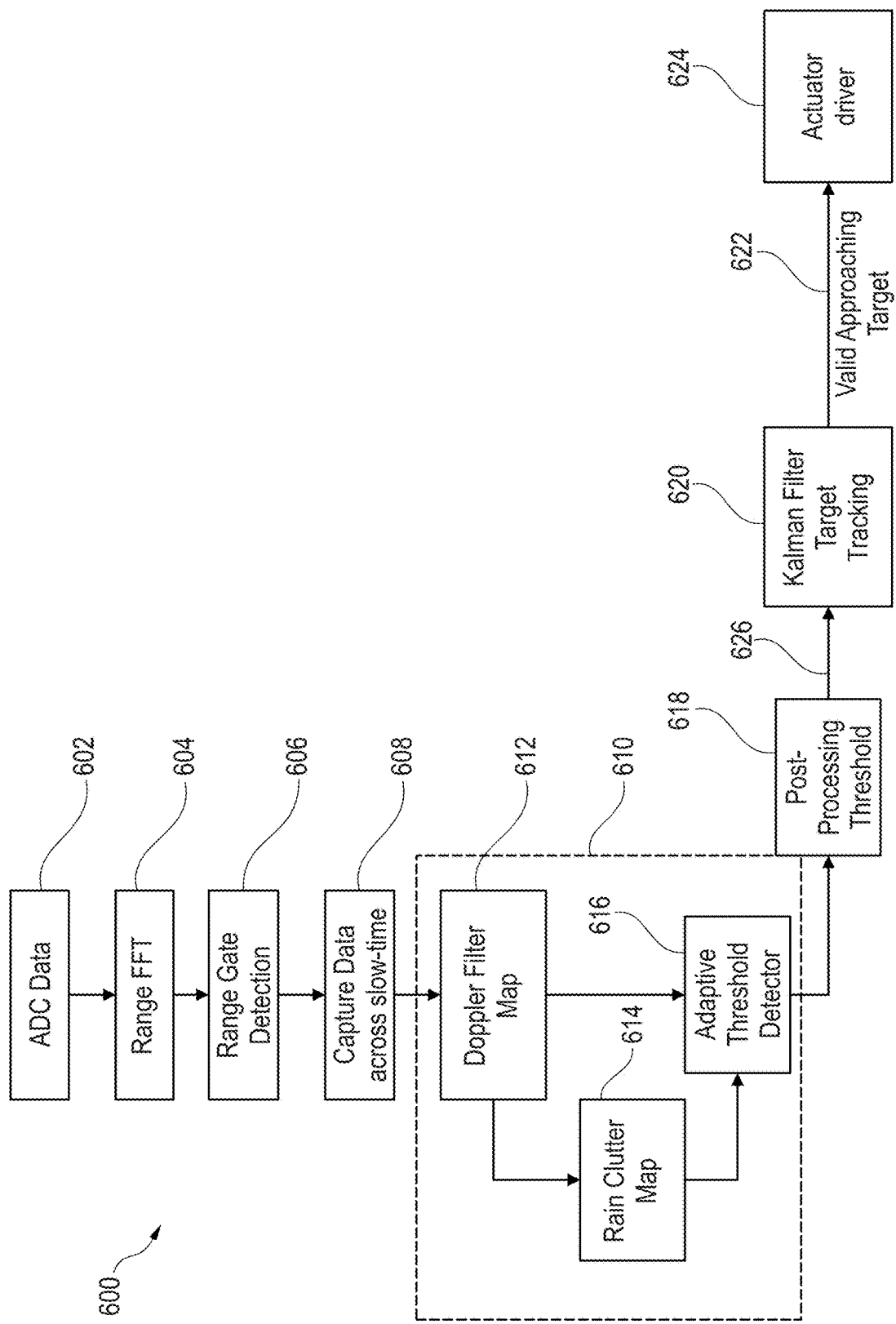
FIG. 6 is an overall flowchart of a radar detection and tracking method in rainfall and snowfall clutter according to an embodiment.

FIG. 6 is an overall flowchart 600 of a radar detection and tracking method in rainfall and snowfall clutter according to an embodiment. Initially, analog return radar signals are processed and converted to digital signals at step 602. Range Fast Fourier Transform ("FFT") digital signal processing is performed at step 604 to change the time-based digital signals into the frequency domain. Range Gate Detection is performed at step 606 to narrow the types of targets. While not limiting, a minimum range of detection is on the order of one meter, while a maximum range of detection is on the order of six meters. Once the Range Gate Detection has been performed at step 606, the output data is captured across slow-time at step 608. In an embodiment, slow-time refers to the pulse dimension, for example the number of pulses transmitted in a pulsed radar as is known in the art.

The captured data is further processed in filter bank 610, which is explained in further detail below, and in further detail with respect to the description of FIG. 7. Returning to FIG. 6, filter bank 610 includes a Doppler filter map 612, a rain clutter map 614, and an adaptive threshold detector 616. A direct connection between the Doppler filter map 612 and the adaptive threshold detector 616 is shown in FIG. 6; this is because the adaptive detection threshold is set by extracting the rain-Doppler components from the Doppler filter map 612. In FIG. 6, the Doppler filter map 612 comprises a plurality of Doppler filters corresponding to a plurality of negative, zero, and positive Doppler velocity bands as will be explained in further detail below. The adaptive threshold detector 616 comprises a plurality of threshold detectors 616 for removing rainfall and snowfall clutter information provided by the rain clutter map 614 as is described in further detail below.

Integration of many pulses using low Doppler side lobes is used to reject rain clutter. Embodiment methods employ adaptive thresholding using the rain clutter map 614 to set the threshold in the adaptive threshold detector 616.

High resolution clutter maps 614 are used to detect tangential targets. Various clutter map techniques are described below, according to embodiments. In general, clutter maps 614 comprise a memory that stores, for each for each range-CPI cell (Coherent Processing Interval cell) in the radar's coverage, the value of the noise and clutter echo in that cell. The clutter echoes can contain snowfall and rainfall echo. The clutter map is for instance implemented using the following recursive filter equation:

$$A(n+1) = \frac{1}{N}A(n) + \left(1 - \frac{1}{N}\right)A(n-1)$$

Wherein A(n) is the amplitude of the near-zero Doppler values, N is the window of the filter, typically N=16, and n is the index of the frame (continuous running).

The recursive filter in the clutter map is used to detect targets whose radial velocity is at or near zero and whose backscatter echo is greater than the clutter and/or noise amplitude stored in the clutter map. The clutter map channel offers a method of detecting targets that are not detected by the subset of the Doppler filters that are adjacent to zero Doppler and whose shape is designed to strongly reject ground echoes near zero Doppler as is described in further detail with respect to FIG. 7. Range cluster processed targets, i.e. range gate gaps of 1-2 are considered as being the same target.

After processing in the filter bank 610, post-processing is performed in post-processing threshold block 618 to generate a valid target signal 626, i.e. a signal indicative of the detection of a person. The valid target signal 626 is tracked using a Kalman filter target tracking block 620 to generate a valid approaching target signal 622, i.e. a signal indicative of the detection of a person moving towards the sensor. The valid approaching target signal can be used as the input signal for an actuator driver 624 associated with an appliance such as an escalator or an automatic door that is also subject to rainfall or snowfall conditions.

Figure 7:
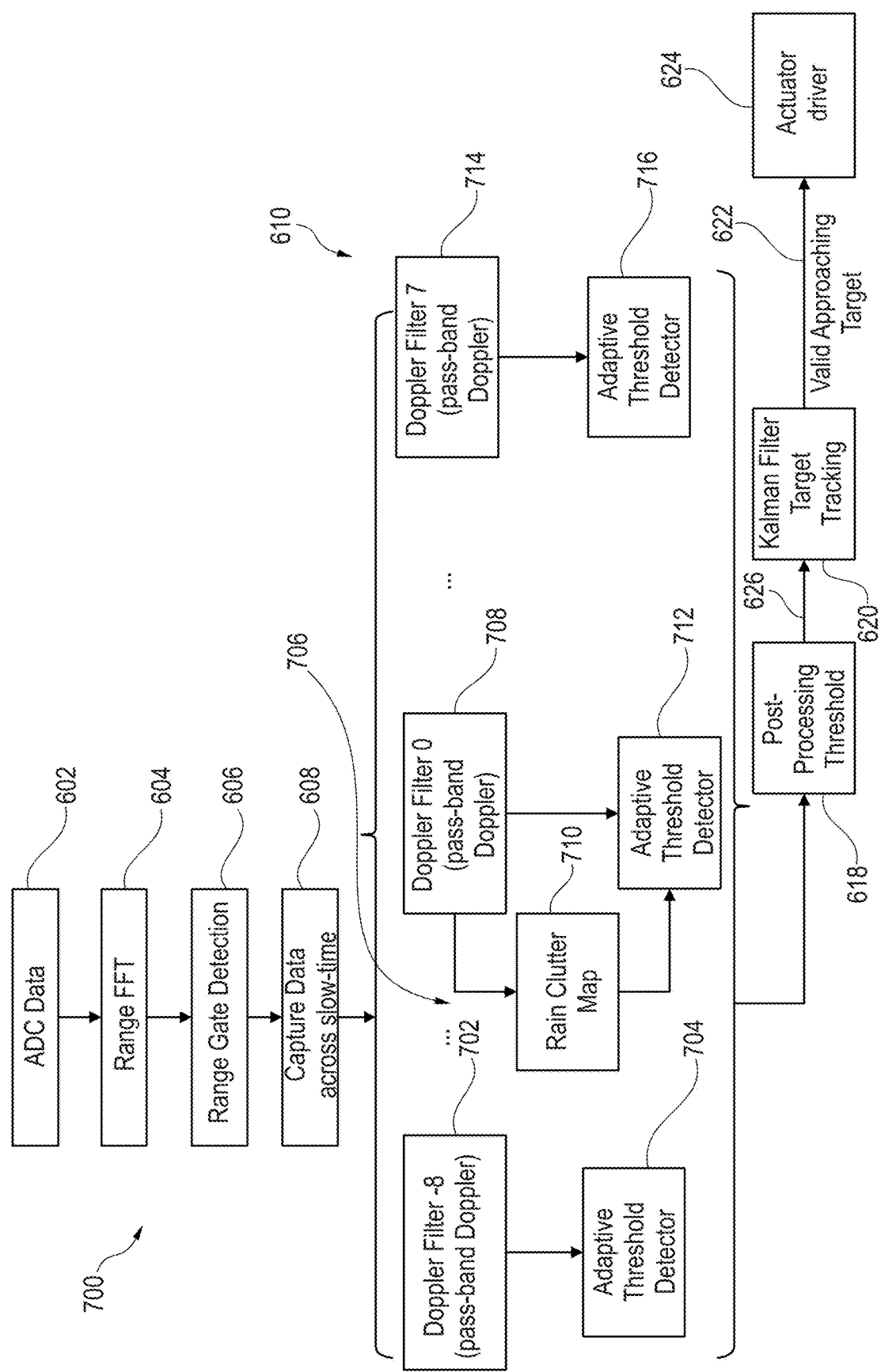
FIG. 7 is a more detailed flowchart of the radar detection and tracking method of FIG. 6, according to an embodiment.

FIG. 7 is a more detailed flowchart 700 of the radar detection and tracking method of FIG. 6, according to an embodiment. Steps 602, 604, 606, 608, 618, 620, and 624 have been previously explained. Further details of the filter bank 610 are shown in FIG. 7. A plurality of Doppler filters each coupled to an adaptive threshold detector is shown. Three to five neighboring filters 706 include a rain clutter map 710, centered around the Doppler filter 0 (pass-band Doppler) 708. Doppler filter 708 is coupled to rain clutter map 710 and adaptive threshold detector 712. The neighboring filters 706 are similarly configured. The remaining Doppler filters do not include a rain clutter map 710. For example Doppler filter-8 (pass-band Doppler) 702 is only coupled to adaptive threshold detector 704. Doppler filter 7 (pass-band Doppler) 714 is only coupled to adaptive threshold detector 716. While Doppler velocity bands-8 through 7 are shown, other bands can be used. Similarly, while three to five neighboring filters 706 are coupled to a rain clutter map, other neighboring filters can also be coupled to a rain clutter map.

Rainfall and snowfall echoes have a Doppler velocity near the Zero Doppler, for example −3 m/s to 3 m/s based on the angle of incidence of the rainfall/snowfall. However this Doppler information is unknown to the system a priori—the actual information in a particular rainfall or snowfall condition will affect the 3-5 Doppler bins/filters around the 0 Doppler bin/filter. These filters/bins are set with rain clutter map 710 as is shown in FIG. 7 by the adaptively adjusting the detection threshold based on the rainfall/snowfall these Doppler frequencies/bins encounter. A human/target above this adaptive threshold dictated by the clutter map is a valid potential target.

The post-processing techniques provided by post-processing block 618 further discriminates between rain/snow clutter and human targets by identifying the spread of the target along the range or range-azimuth. Based on whether the analysis is done on a range-only dimension or a range-azimuth plane a 1D or 2D sliding window is deployed to discriminate between rain/snow and human.

The spread (length) of each target is calculated using the following equation:

length=max{range-gate}−min{range-gate}.

Wherein max{range-gate} is the maximum allowable distance set by the range gate and min{range-gate} is the minimum allowable distance set by the range gate.

If the spread (length) of the target is greater than 60 cm (range-gates depends on the range resolution), the target is classified as rain clutter and not detected as valid target. Once a valid potential target is detected from a Doppler filter bin/map, neighboring range bins are also detected to determine the validity of a target. The range spread of the detected target is determined and if it is within the 60 cm range spread, the detected target is still a valid target. If this exceeds the 60 cm range spread, the detected target and associated range bins are ignored and potentially triggered by the rainfall/snowfall itself. The post-processing step 618 can be executed before or after the Doppler processing step 610.

A nearest neighbor clustering technique is for instance used for target determination, and is illustrated in further detail below with a jump of one range bin. If there is detection on range bins 2, 3, 5, 6, and 7→(2, 7) there is a single target with spread of 5. If there is detection on range bins 12, 15, 16, and 17→(12), (15, 16, 17) there are two targets with spreads of 1 and 3, respectively. If there is detection on range bins: 5, 7, 8, 9, 19, 21, 22, 29→(5, 7, 8, 9), (19, 21, 22) and (29) there are three targets with spreads of 4, 3 and 1, respectively.

Target range spread is thus calculated by the following equation:

Range spread indices (i.e. if three consecutive range bins are excited)*range resolution=target range spread<=60 cm→valid potential target.

Figure 8:
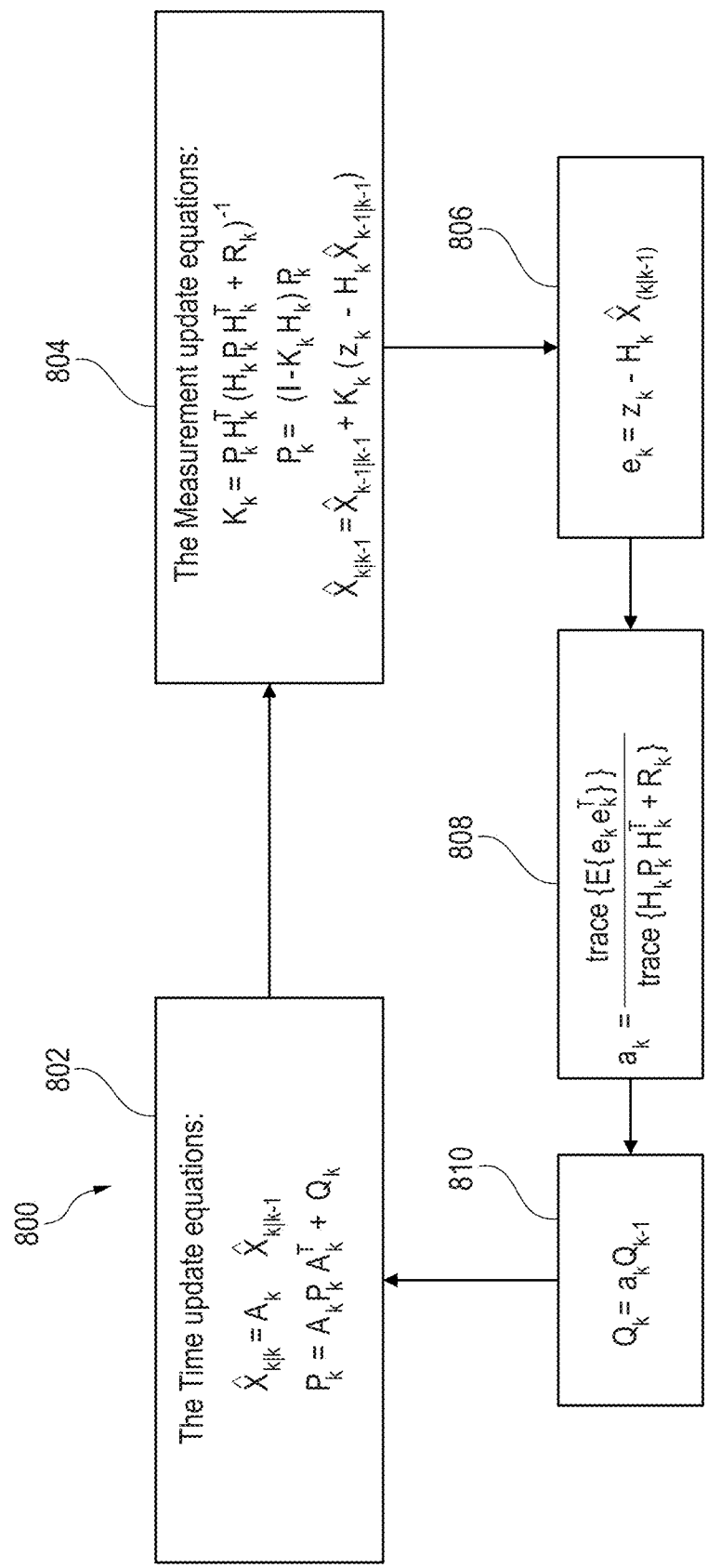
FIG. 8 is a diagram of the equations used in user position and velocity tracking, according to an embodiment.

User position and velocity tracking equations are shown in FIG. 8, which are used in the digital signal processing chip of the radar system, according to embodiments. The time update equations are shown in block 802, the measurement update equations are shown in block 804, and further updating equations for use with the time and measurement update equations are shown in blocks 806, 808, and 810. The equations shown in FIG. 8 are used in the algorithm shown in FIG. 6. The range and velocity are estimated from the blocks shown in FIG. 6 and are the input to block 620 (Kalman filter target tracking). The range gate is determined by a detection along the Fast Time range FFT, whereas the Doppler FFT detection is done through the Adaptive Clutter Map thresholding along the slow time/Doppler FFT.

A constant velocity model is used with the following parameters $\hat{x}_k = [r_k, v_k]$ and $$H_k = \begin{bmatrix} 1 & 0 \\ 0 & 1 \end{bmatrix} \text{ and } A_k = \begin{bmatrix} 1 & \delta t \\ 0 & 1 \end{bmatrix} \text{ and } R_k = \begin{bmatrix} r_{err}^2 & 0 \\ 0 & v_{err}^2 \end{bmatrix}$$

The unknown acceleration is factored in the $Q_k$ model covariance matrix. $A_k$ is the state space matrix, and determines the change of state. $H_k$ is the measurement model. $R_k$ is the estimation error matrix (coming from the sensor estimates). $Q_k$ is the model covariance matrix (since a constant velocity model is used, target acceleration/jerks are accounted for in this matrix). The Kalman filtering described above occurs in block 620 (Kalman filter target tracking) in FIG. 6.

Figure 9:
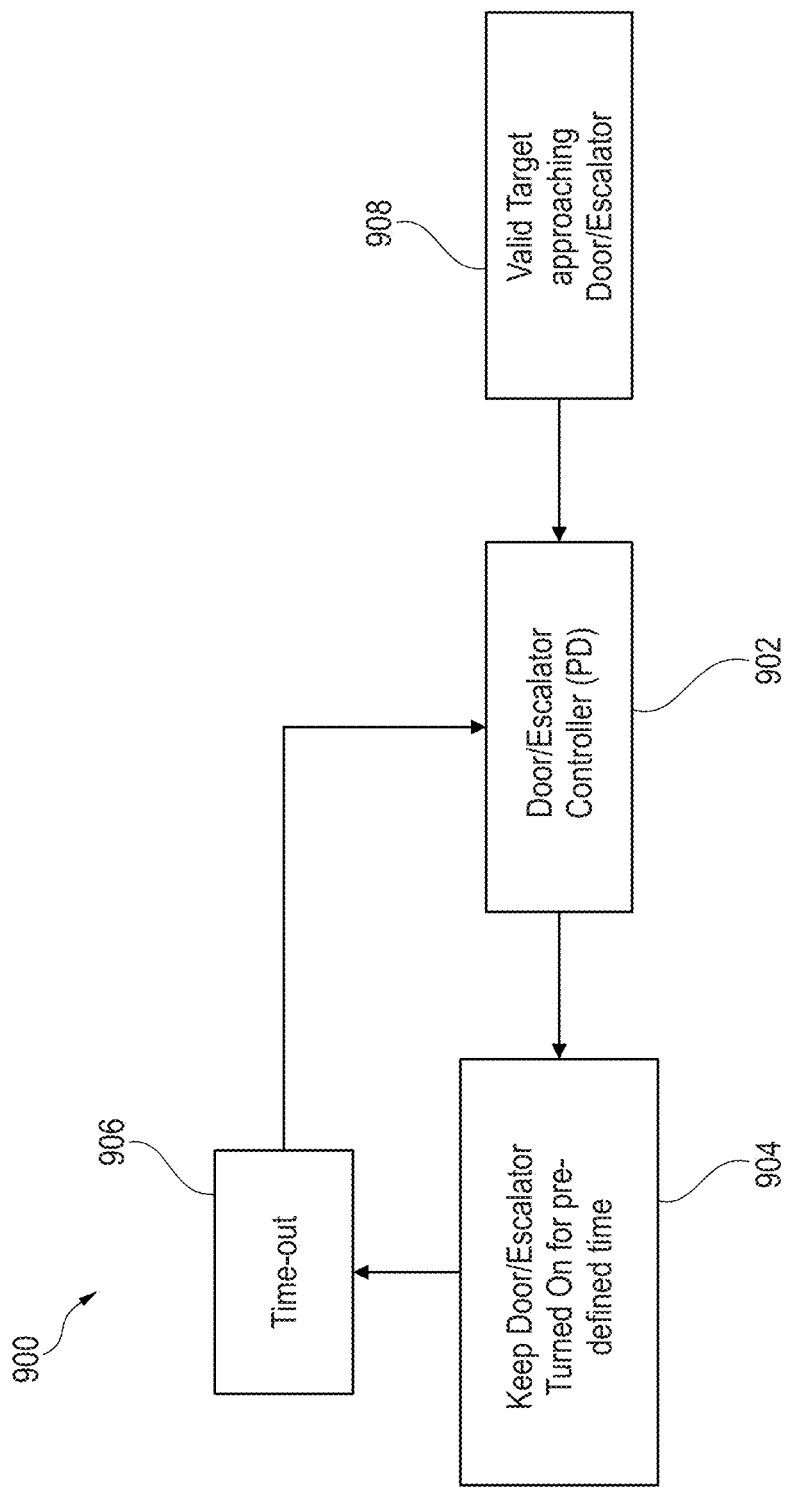
FIG. 9 is a flowchart of actuator logic for controlling an automatic door or escalator in rainfall or snowfall clutter, according to an embodiment.

FIG. 9 is a flowchart 900 of actuator logic for controlling an automatic door or escalator in rainfall or snowfall clutter, according to an embodiment. As previously described, a valid target approaching signal 908 is generated for a door or escalator or other appliance subjected to snowfall or rainfall conditions. The valid approaching signal 908 is used to control the actuator or controller (which in an embodiment can be a Proportional-Derivative controller) for the door or escalator at step 902. At step 904 the door or escalator is turned on for a predetermined time set in block 904. After another predetermined period of time the appliance is timed out at step 906.

Application use cases include but are not limited to cases where an approaching human target is detected in snowfall or rainfall conditions and robust and reliable escalator control and automatic door opening is desired and achieved despite the escalator or automatic door being exposed to the snowfall or rainfall conditions.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A radar system comprising:
    a radio frequency (RF) circuit configured to generate a transmit signal and to receive a corresponding receive signal from a target during rainfall or snowfall conditions; and
    a signal processing circuit coupled to the RF circuit configured to generate an adaptive filter threshold in response to the rainfall or snowfall conditions, and to generate a valid target signal in response to a portion of the receive signal above the adaptive filter threshold,
    wherein the signal processing circuit comprises a plurality of pass-band Doppler filters having a corresponding plurality of range bins, and wherein the valid target signal is generated when a target range spread of three consecutive range bins of the plurality of pass-band Doppler filters is less than a predetermined length.

2. The radar system of claim 1, wherein at least one of the plurality of pass-band Doppler filters comprises a clutter map for generating the adaptive filter threshold.

3. The radar system of claim 1, wherein the signal processing circuit comprises target tracking circuitry for generating a valid approaching target signal.

4. The radar system of claim 3, further comprising an actuator driver for receiving the valid target approaching signal.

5. The radar system of claim 1, wherein the radar system further comprises a semiconductor package.

6. The radar system of claim 5, wherein the semiconductor package further comprises a plastic shield.

7. The radar system of claim 5, wherein the semiconductor package further comprises a lens.

8. The radar system of claim 1, wherein the radar system comprises further comprises a printed circuit board (PCB).

9. The radar system of claim 8, wherein the PCB further comprises a plastic shield.

10. A method for detecting a target during rainfall or snowfall conditions comprising:
    generating a transmit signal;
    receiving a receive signal from a target during rainfall or snowfall conditions, the receive signal comprising an echo of the transmit signal;
    generating an adaptive filter threshold in response to the rainfall or snowfall conditions;
    generating a valid target signal in response to a portion of the receive signal above the adaptive filter threshold; and
    measuring a range spread of the receive signal,
    wherein generating the valid target signal comprises using a plurality of pass-band Doppler filters having a corresponding plurality of range bins, and wherein the valid target signal is generated when the range spread of three consecutive range bins of the plurality of pass-band Doppler filters is less than a predetermined length.

11. The method of claim 10 further comprising tracking the target to generate a valid approaching target signal.

12. The method of claim 11 further comprising controlling an operation of an escalator with the valid approaching target signal.

13. The method of claim 11 further comprising controlling an operation of a door with the valid approaching target signal.

14. An integrated radar system comprising:
    a transmit antenna;
    a receive antenna;
    RF and baseband circuitry in communication with the transmit antenna and the receive antenna; and
    digital signal processing circuitry in communication with the RF and baseband circuitry, the digital signal processing circuitry comprising a plurality of Doppler filters each coupled to an adaptive threshold detector, wherein at least one of the Doppler filters and at least one of the adaptive threshold detectors are coupled together by a rain clutter map, wherein the plurality of Doppler filters have a corresponding plurality of range bins, and wherein a valid target signal is generated when a target range spread of three consecutive range bins of the plurality of Doppler filters is less than a predetermined length.

15. The integrated radar system of claim 14, wherein the integrated radar system is integrated into a single package.

16. The integrated radar system of claim 15, further comprising a lens.

17. The integrated radar system of claim 14, wherein the integrated radar system is integrated onto a printed circuit board.

18. The integrated radar system of claim 14, further comprising an output for controlling an actuator driver.

19. The radar system of claim 1, wherein the predetermined length is 60 cm.

20. The method of claim 10, wherein the predetermined length is 60 cm.

* * * * *